United States Patent [19]
Maruyama et al.

[11] Patent Number: 5,818,549
[45] Date of Patent: Oct. 6, 1998

[54] ACTIVE MATRIX SUBSTRATE AND MANUFACTURING METHOD OF THE SAME

[75] Inventors: Yuko Maruyama, Tenri; Yuzuru Kanemori, Nara, both of Japan

[73] Assignee: Sharp Kabushiki Kaisha, Osaka, Japan

[21] Appl. No.: 810,385

[22] Filed: Mar. 3, 1997

[30] Foreign Application Priority Data

Apr. 26, 1996 [JP] Japan ................................ 8-107239

[51] Int. Cl.⁶ .................. G02F 1/136; G02F 1/1343; H10L 29/04; H10L 31/036
[52] U.S. Cl. ........................ 349/42; 349/139; 257/59
[58] Field of Search ................ 349/42, 139; 257/59

[56] References Cited

U.S. PATENT DOCUMENTS

| | | | |
|---|---|---|---|
| 5,021,850 | 6/1991 | Tanaka et al. | 357/23.7 |
| 5,187,602 | 2/1993 | Ikeda et al. | 349/42 |
| 5,446,562 | 8/1995 | Sato et al. | 349/42 |
| 5,539,551 | 7/1996 | Nomoto et al. | 349/42 |
| 5,668,650 | 9/1997 | Mori et al. | 349/42 |

FOREIGN PATENT DOCUMENTS

| | | | |
|---|---|---|---|
| 3-243925 | 10/1991 | Japan . | |
| 5-100250 | 4/1993 | Japan | 349/42 |

*Primary Examiner*—William L. Sikes
*Assistant Examiner*—Toan Ton
*Attorney, Agent, or Firm*—Nixon & Vanderhye, P.C.

[57] ABSTRACT

First and second gate insulating films, a semiconductor layer made of a-Si(i), and an etching stopper layer are formed to cover a gate electrode on a glass substrate. A drain electrode side contact layer and a source electrode side contact layer are made out of a-Si($n^+$) in such a manner to be cut off on the etching stopper layer. A disconnection preventing a-Si ($n^+$) wire is formed below a source wire in its longitudinal direction, and atop of which a pixel electrode is formed. Since the disconnection preventing a-Si($n^+$) wire and source electrode side contact layer are spaced apart, static-induced characteristics deterioration of TFT and the point and line defects during the substrate fabrication sequence can be eliminated and the non-defective ratio of the display device can be improved drastically.

7 Claims, 5 Drawing Sheets

ACTIVE MATRIX SUBSTRATE AND MANUFACTURING METHOD OF THE SAME

FIELD OF THE INVENTION

The present invention relates to an active matrix substrate having thereon a matrix of non-linear elements, such as thin film transistors serving as switching elements, and to a manufacturing method of the same.

BACKGROUND OF THE INVENTION

An active matrix type liquid crystal display device comprises an active matrix substrate having thereon a matrix of thin film transistors (hereinafter, referred to as TFTs), another substrate opposing the active matrix substrate, and a liquid crystal component or the like filled in a space between the above two substrates to serve as an optical modulating element.

Conventionally, to prevent disconnection and reduce resistance of signal lines (hereinafter, referred to as source wires) on the active matrix substrate, wires made of n-type semiconductor, such as amorphous silicon (hereinafter, referred to as a-Si), polycrystalline silicon (hereinafter, referred to as p-Si), and microcrystalline silicon (hereinafter, referred to as $\mu$C-Si) are provided below the source wires.

An arrangement of a conventional active matrix substrate will be explained with reference to FIGS. 4 and 5. FIG. 4 is a plan view showing an arrangement of one pixel on the conventional active matrix substrate, and FIG. 5 is a cross section taken on line B—B' in FIG. 4.

As shown in FIG. 4, the active matrix substrate comprises a glass substrate, and atop of which a scanning line (hereinafter, referred to as gate wire) 102a made of metal, such as tantalum (Ta), a source wire 112a made of metal, such as titanium (Ti) and Ta, and a TFT 120 connected to both the gate wire 102a and source wire 112a are provided.

One TFT 120 is provided for each pixel and each TFT 120 is arranged in the following manner. That is, as shown in FIG. 5, the gate wire 102a (See FIG. 4) and a gate electrode 102b are made out of metal, such as Ta, on a glass substrate 101. Also, a first gate insulating film 103 is formed to cover both the gate wire 102a and gate electrode 102b. The first gate insulating film 103 is formed by anodizing the metal, out of which the gate wire 102a and gate electrode 102b are made.

A second gate insulating film 104 is made out of silicon nitride (SiNx) to cover the first gate insulating film 103 completely. A semiconductor layer 105 is made out of intrinsic amorphous silicon (hereinafter, referred to as a-Si (i)) on the second insulating film 104 to be spread above the gate electrode 102b.

An etching stopper layer 106 is made out of SiNx at the center of the semiconductor layer 105. A drain electrode side contact layer 107 and a source electrode side contact layer 108 are made out of n$^+$-type silicon over the semiconductor layer 105 and extended onto a part of the etching stopper layer 106 formed on the semiconductor layer 105. In other words, the drain electrode side contact layer 107 and source electrode side contact layer 108 are spaced apart for a predetermined distance on the etching stopper layer 106.

Further, to prevent disconnection and reduce resistance of the source wire 112a, an n$^+$ wire 109 made of n$^+$-type silicon is provided below the source wire 112a. The source electrode side contact layer 108 and n$^+$ wire 109 are patterned to be connected to each other.

In addition, a pixel electrode 110 is formed over the drain electrode side contact layer 107, source electrode side contact layer 108, and n$^+$ wire 109. A drain electrode 111 is made out of metal, such as Ti and Ta, on the pixel electrode 110 to be spread above the drain electrode side contact layer 107. On the other hand, the source wire 112a and a source electrode 112b are made out of metal, such as Ti and Ta, on the pixel electrode 110 to be spread above both the source electrode side contact layer 108 and n$^+$ wire 109. Further, a protection film 113 is made out of silicon nitride to cover the TFT 120, gate wire 102a, source wire 112a, and a pixel opening portion.

Incidentally, static electricity is readily generated during the fabrication sequence of the active matrix substrate (for example, during the dry process like dry etching). Therefore, charges may be accumulated excessively in the n$^+$ wire 109, and cause static-induced damage to the wire portion or TFT 120.

To be more specific, when excessive charges are accumulated in the n$^+$ wire 109, these charges undesirably start to flow into the TFT 120 through the source electrode side contact layer 108 connected to the n$^+$ wire 109, whereby the TFT 120 is destroyed electrically.

Therefore, according to the arrangement of the conventional active matrix substrate, the excessive charges flown into the TFT 120 cause the static-induced damage, and hence, the malfunction of the same. Consequently, characteristics deterioration of the TFT 120 causes a pixel defect, namely, a point defect. Further, a group of point defects lined up through the source wire 112a can cause a line defect.

Although an occurrence ratio of the above static-induced characteristics deterioration of the TFT 120 varies with display device models, a practical ratio ranges from 5% to 15%, which is enough to reduce the non-defective ratio drastically.

During the fabrication sequence of the active matrix substrate, the source wire 112a is shorted with a metal line (short-ring) provided at the edge of the glass substrate 101 in such a manner to encircle the pixel portion. Therefore, the source wire 112a is completely protected from the static-induced damage, but in general, no preventive measure against the static-induced damage is taken for the n$^+$ wire 109.

SUMMARY OF THE INVENTION

It is therefore an object of the present invention to provide (1) an active matrix substrate which can reduce point and line defects resulted from characteristics deterioration of a TFT caused by its static-induced damage during, for example, a dry etching step and improve a non-defective ratio, and (2) a method of manufacturing such an active matrix substrate.

To fulfill the above object, an active matrix substrate of the present invention is characterized by being furnished with:

a plurality of scanning lines and a plurality of signal lines intersecting each other, n$^+$ wires made of n$^+$-type semiconductor, each n$^+$ wire being provided below and along each signal line, respectively; and switching elements respectively provided to each intersection of the scanning lines and signal lines, each switching element including a contact layer made of n$^+$-type semiconductor out of which the n$^+$ wires are made, wherein the contact layer and each n$^+$ wire are provided in such a manner to keep a space therebetween.

According to the above arrangement, a plurality of scanning lines and a plurality of signal lines are provided to intersect each other, and switching elements, such as thin film transistors, are provided respectively to each intersection. Also, the n+ wires made of n+-type semiconductor are provided respectively along each signal line.

Since the contact layer and n+ wire, both of which are made of n+-type semiconductor, are spaced apart, no static electricity generated during, for example, the dry etching step, flows into the switching elements, such as the thin film transistors, through the n+ wires, thereby eliminating the accumulation of excessive charges in the switching elements.

Thus, the above arrangement makes it possible to eliminate characteristics deterioration of the switching elements, while preventing the point defects and the line defect that occurs when a group of point defects are lined up through the signal line. Consequently, the non-defective ratio of the display device can be improved.

Also, to fulfill the above object, a present method of manufacturing an active matrix substrate composed of at least a plurality of scanning lines and a plurality of signal lines intersecting with the scanning lines, and switching elements each having a contact layer and provided near each intersection of the scanning lines and signal lines, respectively, is characterized by having the steps of:

forming each contact layer out of n+-type semiconductor; and forming an n+ wire out of n+-type semiconductor below and along each signal line in such a manner to keep a space from each contact layer.

According to the above arrangement, the active matrix substrate is composed of at least a plurality of scanning lines and a plurality of signal lines intersecting with the scanning lines, and the switching elements, such as thin film transistors, provided at each intersection of the scanning lines and signal lines, respectively.

Since the n+ wires made out of n+-type semiconductor below the signal lines are separated from the contact layer also made out of n+-type semiconductor in each switching element, no static electricity generated during the fabrication sequence (for example, the dry process like dry etching) is conveyed to the switching elements through the n+ wires. Therefore, it has become possible to eliminate excessive charge accumulation in the switching elements, which causes static-induced damage to the switching element and the characteristics deterioration of the same.

Thus, the above arrangement can prevent the point defects resulted from the characteristics deterioration of the switching elements and the line defect that occurs when a group of point defects are lined up through the signal line. Consequently, the non-defective ratio of the display device can be improved.

For a fuller understanding of the nature and advantages of the invention, reference should be made to the ensuing detailed description taken in conjunction with the accompanying drawings.

DESCRIPTION OF THE EMBODIMENTS
(EMBODIMENT 1)

Figure 1:
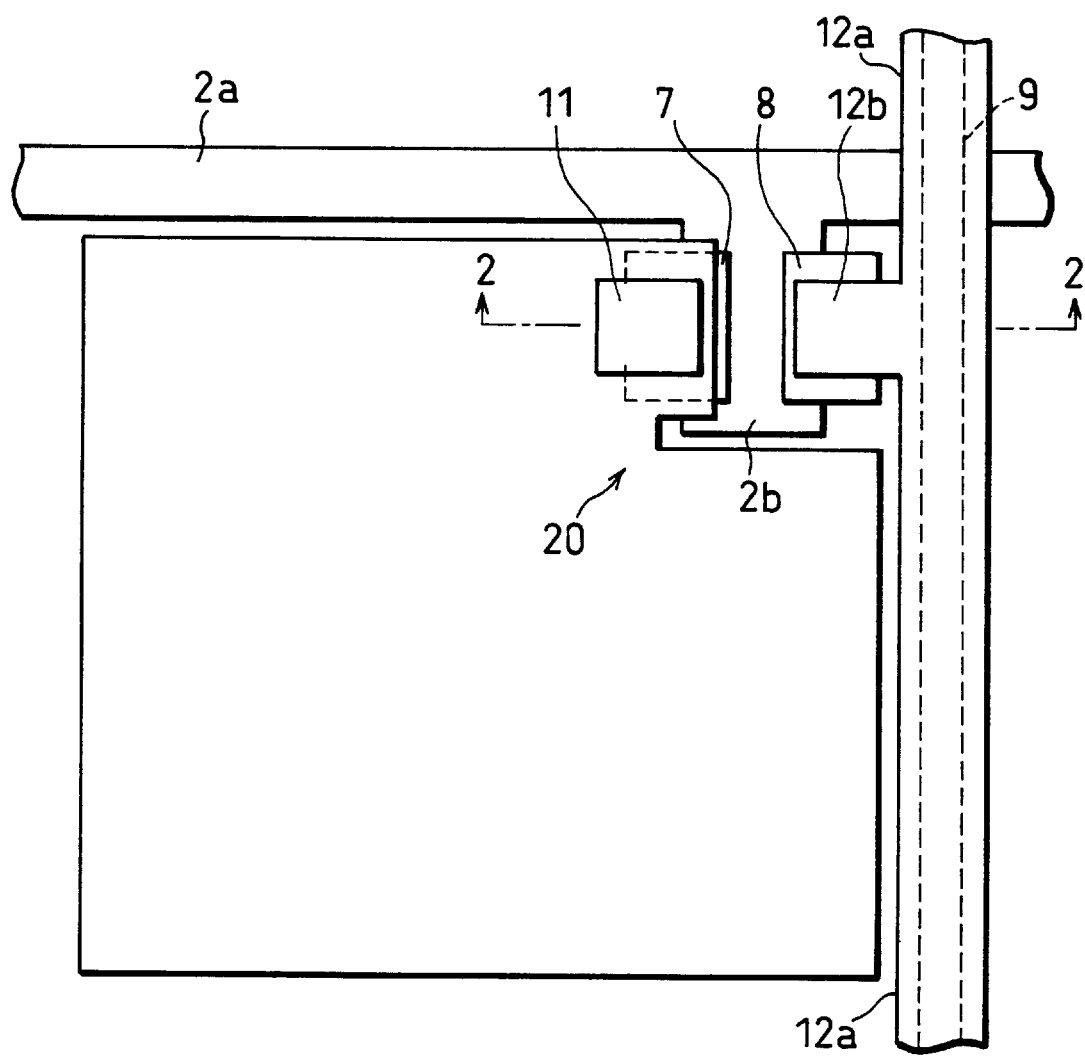
FIG. 1 is a plan view showing an arrangement of a pixel portion of an active matrix substrate in accordance with an example embodiment of the present invention.
Figure 2:
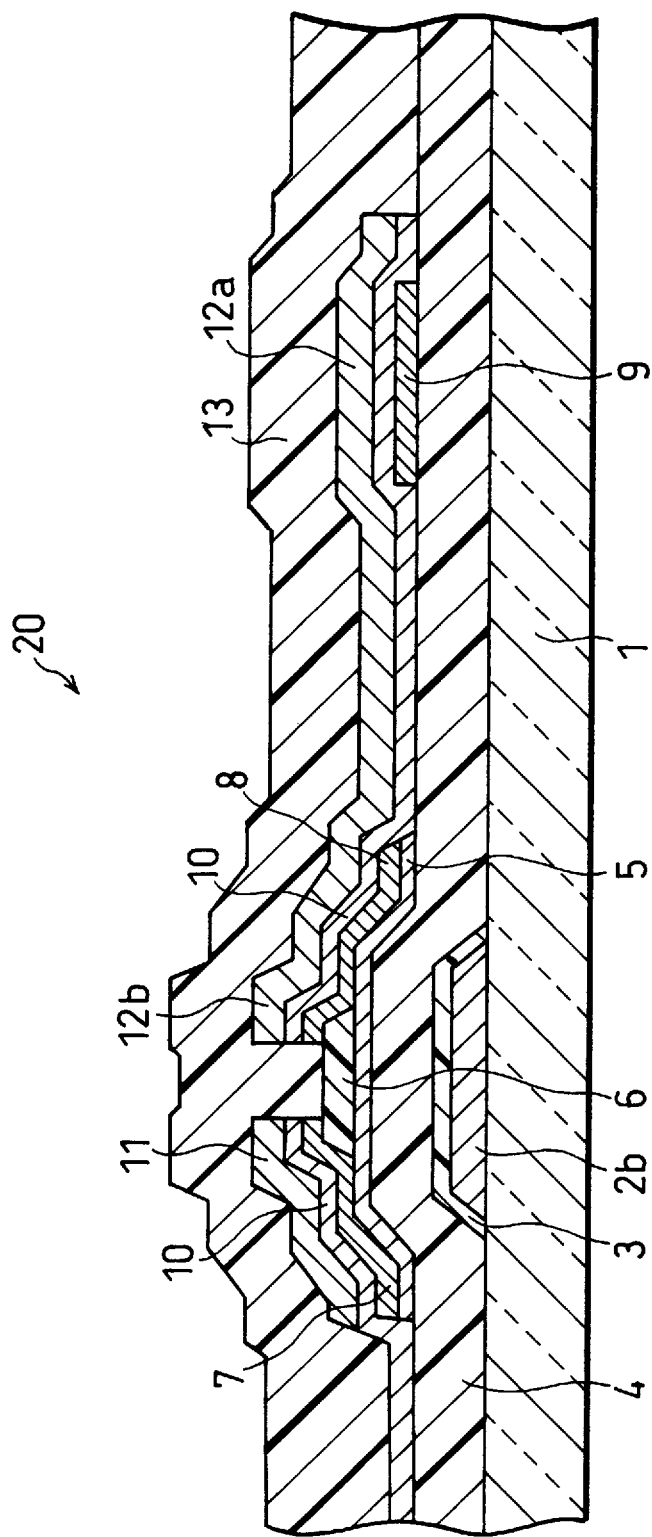
FIG. 2 is a cross section taken on line A—A' in FIG. 1.

Referring to FIGS. 1 and 2, the following description will describe an example embodiment of the present invention. FIG. 1 is a plan view schematically showing an arrangement of an active matrix substrate in accordance with the present embodiment, and FIG. 2 is a cross section taken on line A—A' in FIG. 1.

As shown in FIGS. 1 and 2, an active matrix substrate of the present embodiment comprises a glass substrate, and atop of which a gate wire 2a made of metal, such as tantalum (Ta), a source wire 12a made of metal, such as titanium (Ti) and Ta, and a TFT 20 connected to both the gate wire 2a and source wire 12a are provided.

One TFT 20 is provided for each pixel and each TFT 20 is arranged in the following manner. That is, as shown in FIG. 2, the gate wire 2a (see FIG. 1) and a gate electrode 2b branched from the gate wire 2a are made out of metal, such as Ta, on a transparent insulating glass substrate 1. A first gate insulating film 3 is formed to cover both the gate wire 2a and gate electrode 2b. The first gate insulating film 3 is formed by anodizing the metal, out of which the gate wire 2a and gate electrode 2b are made.

Also, a second gate insulating film 4 is made out of silicon nitride (SiNx) to cover the first gate insulating film 3 completely. A semiconductor layer 5 is made out of a-Si(i) on the second gate insulating film 4 to be spread above the gate electrode 2b.

An etching stopper layer 6 is made out of SiNx at the center of the semiconductor layer 5. A drain electrode side contact layer 7 and a source electrode side contact layer 8 are made out of n+-type a-Si (hereinafter, referred to as a-Si(n+)) over the semiconductor layer 5 and extended onto a part of the etching stopper layer 6 formed atop of the semiconductor layer 5. In other words, the drain electrode side contact layer 7 and source electrode side contact layer 8 are spaced apart for a predetermined distance on the etching stopper layer 6.

Further, to prevent disconnection and reduce resistance of the source wire 12a, an a-Si(n+) wire 9 is made out of a-Si(n+) below the source wire 12a along its longitudinal direction.

A pixel electrode 10 is formed over the drain electrode side contact layer 7, source electrode side contact layer 8, and a-Si(n+) wire 9. A drain electrode 11 is made out of metal, such as Ti and Ta, on the pixel electrode 10 to be spread above the drain electrode side contact layer 7. On the other hand, the source wire 12a is made out of metal, such as Ti and Ta, on the pixel electrode 10 to be spread above the a-Si(n+) wire 9. Also, a source electrode 12b is made out of metal, such as Ti and Ta, on the pixel electrode 10 to be spread above the source electrode side contact layer 8. Further, a protection film 13 is made out of silicon nitride to cover the TFT 20, gate wire 2a, source wire 12a, and a pixel opening portion.

In the active matrix substrate of the present embodiment, a 3 μm-space is secured between the a-Si(n+) wire 9 provided below the source wire 12a to prevent disconnection and reduce resistance of the source wire 12a and the source electrode side contact layer 8 below the source electrode 12b. Although it will be described below, the a-Si (n+) wire 9 and source electrode side contact layer 8 are patterned to keep a space therebetween through photolithography followed by etching.

Note that if a space in the mask pattern of the a-Si(n+) wire 9 and source electrode side contact layer 8 is less than 1 μm, the a-Si(n+) wire 9 and source electrode side contact layer 8 are not spaced apart sufficiently, and may be connected to each other electrically. Thus, the space in the mask pattern must be at least 1 μm.

On the other hand, if the space in the mask pattern is 3 μm or greater, the a-Si(n$^+$) wire 9 and source electrode side contact layer 8 are spaced apart in a reliable manner. However, if the space in the mask pattern is excessively large, the TFT 20 is upsized and the numerical aperture is undesirably reduced. Thus, it is preferable to keep the space in the mask pattern 4 μm or less.

For the above reasons, the space in the mask pattern of the a-Si(n$^+$) wire 9 and source electrode side contact layer 8 is designed to be in a range between 1 μm and 4 μm inclusive, and more preferably, between 3 μm and 4 μm inclusive. Accordingly, a space in a range between 1 μm and 4 μm inclusive, and more preferably, between 3 μm and 4 μm inclusive, is secured between the a-Si(n$^+$) wire 9 and source electrode side contact layer 8. Thus, it has become possible to space apart the source electrode side contact layer 8 and a-Si(n$^+$) wire 9 in a reliable manner while maintaining the numerical aperture.

Next, a method of manufacturing the above-arranged active matrix substrate will be explained.

To begin with, a Ta film of 5000 Å thick is sputtered on the transparent insulating substrate 1 in a plasmic atmosphere of a mixed gas of $CF_4$ and $O_2$, and a pattern is imprinted in the above Ta through photolithography. Then, the gate wire 2a and the gate electrode 2b branched therefrom for each pixel are formed thereon through dry etching.

Although a 5000 Å-thick Ta film is used in the present embodiment, a thickness can vary in a range between 500 Å and 10000 Å.

Also, the popular dry etching is used for etching the Ta film in the present embodiment. However, other than the above dry process, the wet etching method through the wet process using a mixed liquid of hydrofluoric acid and nitric acid as an etching liquid is also applicable.

In case of the wet etching method, although it is not illustrated in the drawing, it is preferable to form a $Ta_2O_5$ film of 1000 Å–10000 Å thick as a base coat layer between the glass substrate 1 and Ta film in advance. Because by so doing, unwanted etching on the glass substrate 1 can be prevented.

Next, the surface of the gate electrode 2b is anodized to form the first gate insulating film 3 of 3000 Å thick out of $Ta_2O_5$. Note that a thickness of the first gate insulating film 3 is not limited to 3000 Å, and it can vary in a range between 500 Å and 5000 Å.

Then, an SiNx film of 3000 Å thick, which will serve as the second gate insulating film 4, is formed over the first gate insulating film 3 through the plasma CVD (Chemical Vapor Deposition) method. In the present embodiment, a double-layer gate insulating film as above are used; however, a single-layer gate insulating film is also applicable.

Next, an a-Si(i) film of 300 Å thick is formed over the second gate insulating film 4 to be spread above the gate electrode 2b.

Further, after an SiNx film of 3000 Å thick is formed over the a-Si(i) film, a desired pattern is etched into the SiNx film using a BHF liquid (hydrofluoric acid and ammonium fluoride) to form the etching stopper layer 6.

Thicknesses of the second gate insulating film 4, a-Si(i) film, etching stopper layer 6 are not limited to the above-specified values, and a thickness of each can vary in ranges between 500 Å and 6000 Å, 300 Å and 1000 Å, and 500 Å and 6000 Å, respectively.

Next, an a-Si(n$^+$) film of 500 Å thick is formed over the a-Si(i) film and etching stopper layer 6 through the plasma CVD method. Subsequently, the a-Si(n$^+$) film and the a-Si(i) film formed formerly are patterned concurrently into islands through photolithography followed by etching to make the drain electrode side contact layer 7, source electrode side contact layer 8 and a-Si (n$^+$) wire 9 out of a-Si (n$^+$), and the semiconductor layer 5 out of a-Si(i).

Herein, a 500 Å-thick a-Si (n$^+$) film is used; however, a thickness can vary in a range between 200 Å and 2000 Å.

In addition, each mask pattern used in the above photolithography is designed to have a space in a range between 1 μm and 4 μm inclusive, and more preferably, between 3 μm and 4 μm inclusive, for the reasons explained above.

The photolithography using the above-designed pattern followed by the etching can space apart the source electrode side contact layer 8 and a-Si (n$^+$) wire 9 in a reliable manner while maintaining the numerical aperture. Herein, a 3 μm-space is secured between the a-Si(n$^+$) wire 9 and source electrode side contact layer 8.

Also, it is preferable to use an exposing device having an exposing accuracy of at least 2 μm, and more preferably at least 1 μm, to prevent the physical contact during the patterning between the source electrode side contact layer 8 below the source electrode 12b and the a-Si(n$^+$) wire 9 provided to prevent disconnection or the like of the source wire 12a, which occurs often in the conventional active matrix substrate. An active matrix substrate manufactured under the above conditions causes neither the point defects nor line defect.

Then, after either a single-layer or multi-layer film made of ITO (Indium Tin Oxide), $SnO_2$, or $InO_3$, is sputtered, the pixel electrode 10 of 1500 Å thick is formed thereon. A thickness of the pixel electrode 10 is not limited to 1500 Å, and it can vary in a range between 300 Å and 3000 Å.

Further, a Ti or Ta film of 3000 Å thick is sputtered on the pixel electrode 10. Then, the Ti or Ta film is made into a desired pattern through the photolithography followed by etching to form the drain electrode 11, source wire 12a, and source electrode 12b. Thicknesses of the drain electrode 11, source wire 12a, and source electrode 12b are not limited to 3000 Å, and each can vary in a range between 500 Å and 5000 Å.

Then, an SiNx film of 3000 Å thick is formed through the plasma CVD method to serve as the protection film 13. A thickness of the protection film 13 is not limited to 3000 Å, and it can vary in a range between 500 Å and 6000 Å. In accordance with the above procedure, an active matrix substrate of the present invention is fabricated.

Figure 4:
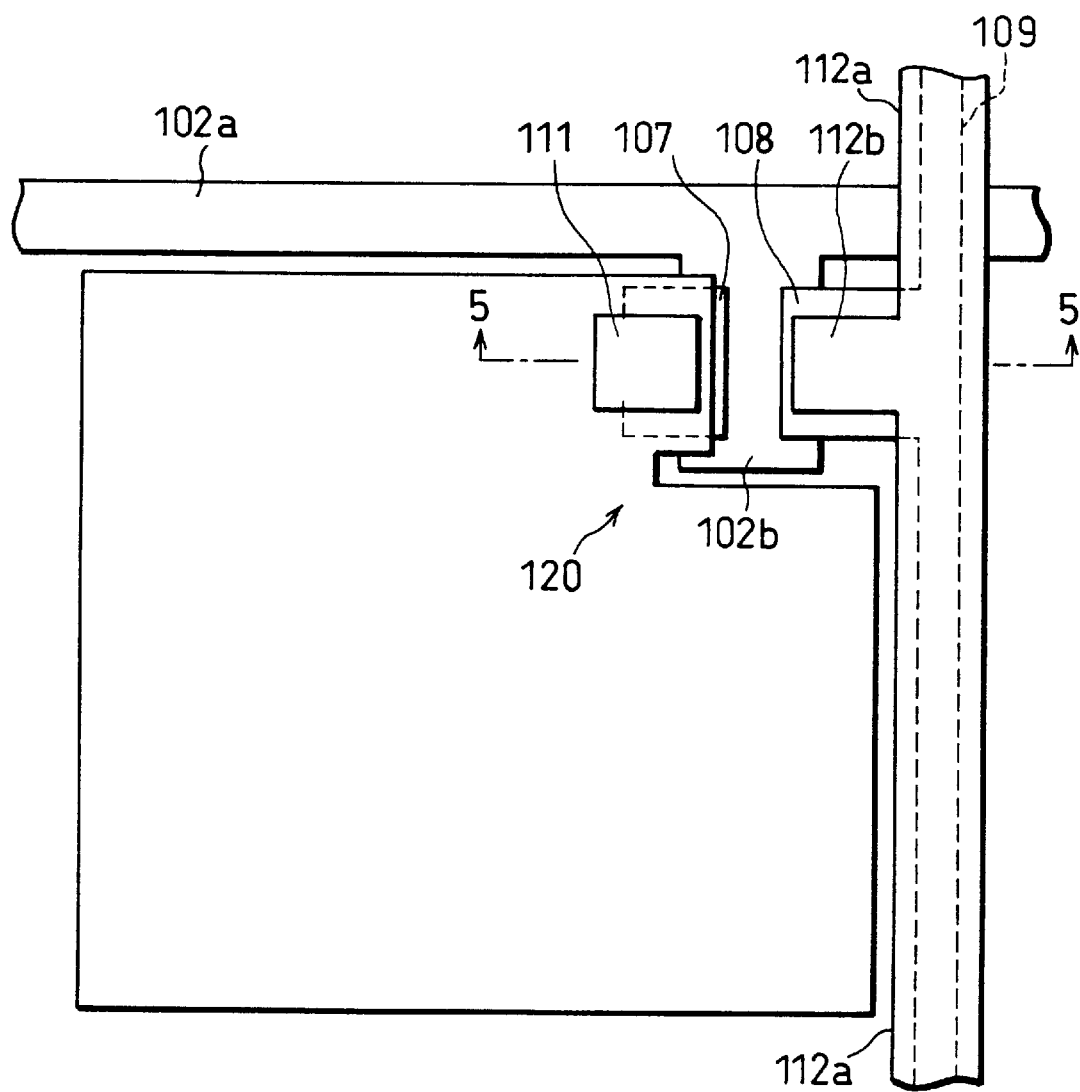
FIG. 4 is a plan view showing an arrangement of a pixel portion of a conventional active matrix substrate.
Figure 5:
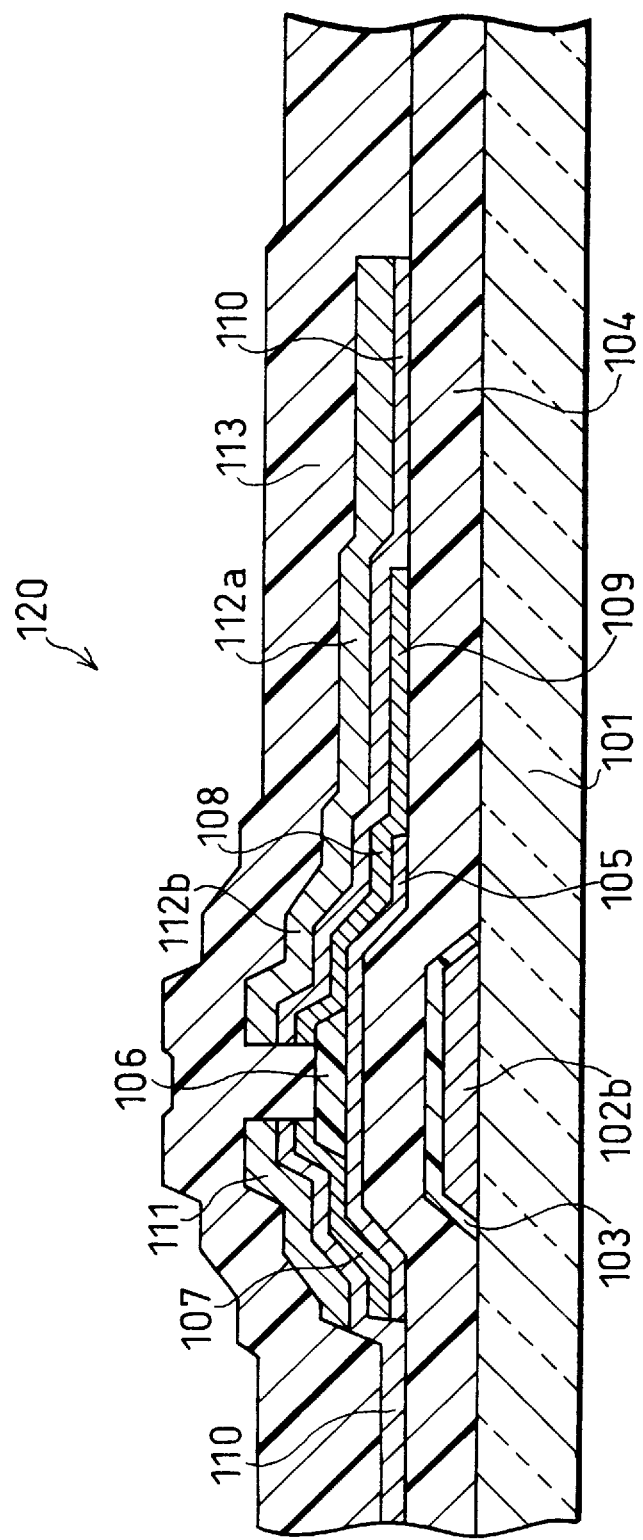
FIG. 5 is a cross section taken on line B—B' in FIG. 4.

Here, some models of liquid crystal display device having different pixel numbers are assembled using the active matrix substrate of the present embodiment. A defect occurrence ratio of each model in case of using the active matrix substrate of the present invention and, for comparison, in case of using the conventional one is evaluated and the result of which is set forth in Table 1 below. The above occurrence ratio can also represent an occurrence ratio of the point and line defects caused by the excessively accumulated charges in the a-Si(n$^+$) wire 9 or n$^+$ wire 109 (see FIG. 4).

TABLE 1

|  | MODEL | | |
| --- | --- | --- | --- |
|  | 10.4 VGA | 11.3 S-VGA | 12.1 XGA |
| PRESENT INVENTION | 0% | 0% | 0% |
| CONVENTIONAL | 12% | 9% | 7% |

The pixel number in each model is as follows:

| MODEL | PIXEL NUMBERS |
|---|---|
| 10.4-inch VGA | 640 × 480 × RGB |
| 11.3-inch S-VGA | 800 × 600 × RGB |
| 12.1-inch XGA | 1024 × 768 × RGB |

As is understood from Table 1 above, the models using the conventional active matrix substrates have a defect occurrence ratio of 7–12%, while the models using the active matrix substrate of the present invention have a defect occurrence ratio of nil (0). Thus, the above result obviously shows the effects of the present invention, that is, eliminating the characteristics deterioration of the TFT 20 caused by the excessively accumulated charges in the a-Si(n$^+$) wire 9, and hence point defects resulted from the characteristics deterioration and the line defect that occurs when a group of point defects are lined up through the source wire 12a.

As has been explained, in the active matrix substrate of the present invention: a plurality of gate wires 2a and a plurality of source wires 12a intersect with each other; and the TFTs 20 are provided in the vicinity of each intersection of the gate wires 2a and source wires 12a, respectively, and in each TFT 20: the pixel electrode 10 is formed in an area encircled by at least two gate wires 2a and two source wires 12a; both the source electrode side contact layer 8 and a-Si(n$^+$) wire 9 which is provided below the source wire 12a along its longitudinal direction are made of n$^+$-type semiconductor; and notably, the source electrode side contact layer 8 and a-Si(n$^+$) wire 9 provided along the source wire 12a are spaced apart.

Therefore, static electricity generated during, for example, the dry etching step does not flow into the TFT 20 through the a-Si(n$^+$) wire 9. In short, no excessive charges are added to the TFT 20. Thus, this arrangement makes it possible to eliminate not only the characteristics deterioration of the TFT 20, but also the point defects and line defect that occurs when a group of point defects are lined up through the source wire 12a. As a consequence, the non-defective ratio of the display device can be improved.

Also, the manufacturing method of the active matrix substrate of the present invention, in which a plurality of gate wires 2a and a plurality of source wires 12a intersect with each other; the TFTs 20 are provided in the vicinity of each intersection of the gate wires 2a and source wires 12a, respectively; and the pixel electrode 10 is formed for each TFT 20 in an area encircled by at least two gate wires 2a and two source wires 12a, comprises the steps of (1) forming the source electrode side contact layer 8 of the TFT 20 out of n$^+$-type semiconductor, and (2) forming the a-Si(n$^+$) wire 9 below the source wire 12a out of the same material as the source electrode side contact layer 8 in such a manner to keep a space from the source electrode side contact layer 8.

Therefore, it has become possible to prevent the static-induced damage of the TFT 20 during the substrate fabrication sequence (for example, the dry process like dry etching), and hence the characteristics deterioration of the same. Thus, the point defect caused by the characteristics deterioration of the TFT 20 and the line defect that occurs when a group of point defects are lined up through the source wire 12a can be eliminated. As a consequence, the non-defective ratio of the display device can be improved.

Both the gate wire 2a and gate electrode 2b are formed through the dry etching of Ta covering the glass substrate 1 in the present embodiment. This is because the dry etching is advantageous over the wet etching in that a finishing shape can be controlled easily, and this advantage makes the dry etching useful when manufacturing the active matrix substrate of the present invention.

Herein, a-Si is used as the n$^+$-type semiconductor; however, it should be noted that using p-Si or μC-Si can result the same effects explained above.

(Embodiment 2)

Figure 3:
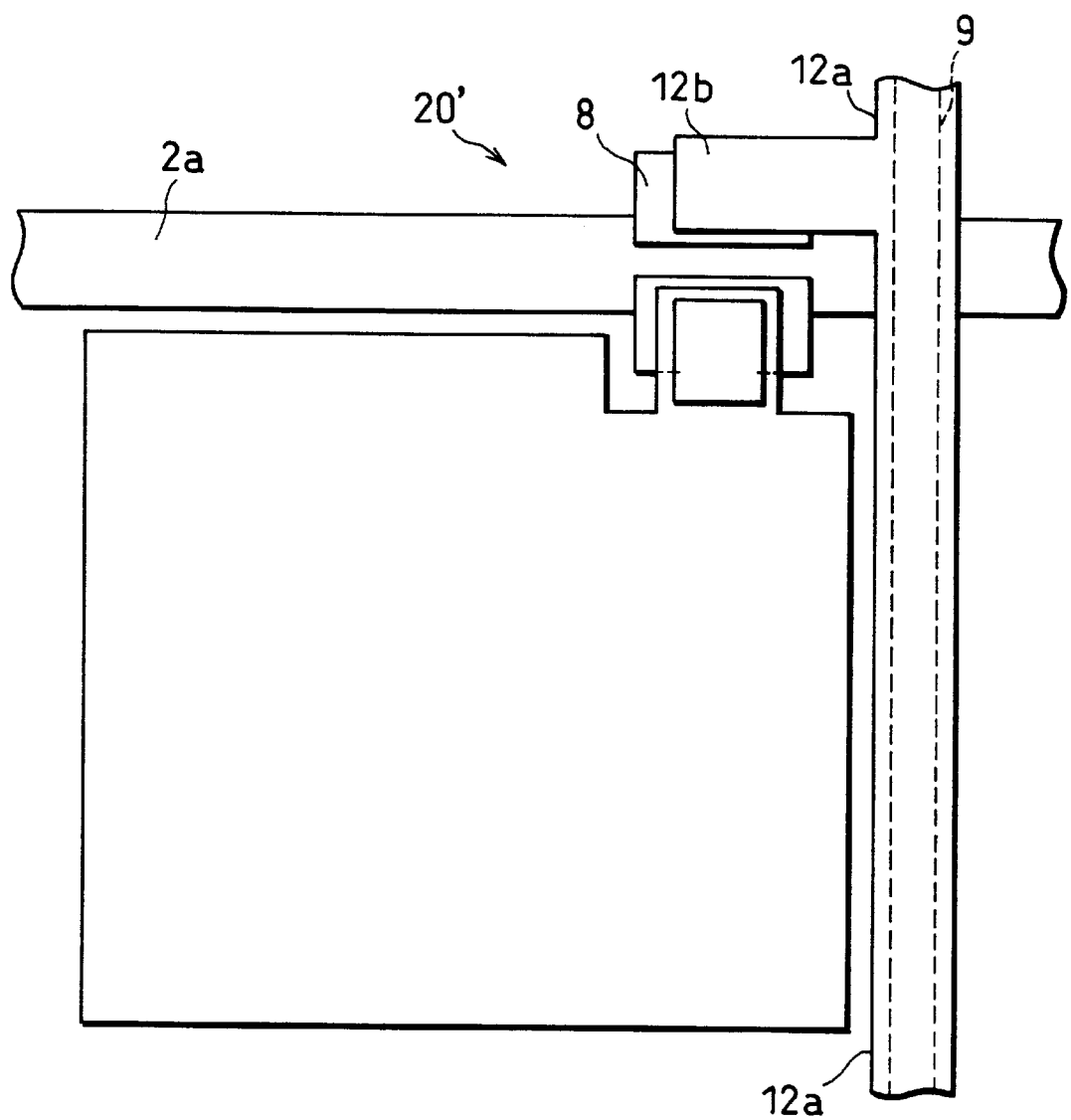
FIG. 3 is a plan view showing an arrangement of a pixel portion of an active matrix substrate in accordance with another example embodiment of the present invention.

Referring to FIG. 3, the following description will describe another example embodiment of the present invention. FIG. 3 is a plan view depicting a pixel portion of an active matrix type in accordance with the present embodiment. Hereinafter, like components are labeled with like reference numerals with respect to Embodiment 1, and the description of these components is not repeated for the explanation's convenience.

An arrangement of the active matrix substrate of the present embodiment will be described briefly. In FIG. 3, a TFT 20' is provided in the vicinity of the intersection of the gate wire 2a and source wire 12a. Unlike the arrangement in Embodiment 1, the gate electrode is not branched from the gate wire 2a herein, and instead, the source electrode 12b is branched and extended from the source wire 12a, and the TFT 20' is placed directly on the gate wire 2a.

Thus, the TFT 20' of the present embodiment and the TFT 20 of Embodiment 1 are different in position and identical in film forming conditions and component members.

The exposing device having an exposing accuracy of at least 2 μm is also used herein, so that the source electrode side contact layer 8 and a-Si(n$^+$) wire 9 do not physically touch during the patterning step like they do in the conventional active matrix substrate.

Herein, to space apart the a-Si(n$^+$) wire 9 and source electrode side contact layer 8, a mask pattern such that can leave a 3 μm-space between the a-Si(n$^+$) wire 9 and source electrode side contact layer 8 is used in the photolithography followed by the etching.

As has been explained, like Embodiment 1, the a-Si(n$^+$) wire 9 provided below the source wire 12a in its longitudinal direction and the source electrode side contact layer 8 of the TFT 20' are spaced apart. Thus, even though static electricity is generated during the dry etching, no excessive charges flow into the TFT 20' from the a-Si(n$^+$) wire 9, thereby eliminating characteristics deterioration of the TFT 20'. Thus, using the active matrix substrate of the present embodiment can eliminate the point and line defects, and therefore, can drastically improve the non-defective ratio of the liquid crystal display device.

In addition, the numerical aperture of the active matrix substrate of the present embodiment remains the same wherever on the gate wire 2a the TFT 20' is formed for each pixel. Thus, it has become possible to take a pixel size into consideration when determining the upper limit of a space in the mask pattern used in the photolithography to space apart the a-Si(n$^+$) wire 9 and source electrode side contact layer 8.

Note that, however, the lower limit of a space in the mask pattern is 1 μm, and more preferably 3 μm, for the same reason explained in Embodiment 1.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An active matrix substrate comprising:
   a plurality of scanning lines and a plurality of signal lines intersecting each other, $n^+$ wires made of $n^+$-type semiconductor, said each $n^+$ wire being provided below and along said each signal line, respectively; and switching elements respectively provided to each intersection of said scanning lines and signal lines, said each switching element including a contact layer made of $n^+$-type semiconductor out of which said $n^+$ wires are made, wherein said contact layer and said each $n^+$ wire are provided in such a manner to keep a space therebetween.

2. The active matrix substrate as defined in claim 1, wherein said space between said contact layer and said each $n^+$ wire is in a range between 1 μm and 4 μm inclusive.

3. The active matrix substrate as defined in claim 1, wherein said space between said contact layer and said each $n^+$ wire is in a range between 3 μm and 4 μm inclusive.

4. The active matrix substrate as defined in claim 1, wherein said switching elements are provided respectively on said scanning lines in a vicinity of each intersection of said scanning lines and signal lines.

5. A method of manufacturing an active matrix substrate comprising at least a plurality of scanning lines and a plurality of signal lines intersecting with said scanning lines, and switching elements each having a contact layer and provided near each intersection of said scanning lines and signal lines, respectively, said method comprising the steps of:

forming said each contact layer out of $n^+$-type semiconductor; and forming an $n^+$ wire out of $n^+$-type semiconductor below and along said each signal line in such a manner to keep a space from said each contact layer.

6. The method of manufacturing an active matrix substrate as defined in claim 5, wherein said predetermined space is in a range between 1 μm and 4 μm inclusive.

7. The method of manufacturing an active matrix substrate as defined in claim 5, wherein said predetermined space is in a range between 3 μm and 4 μm inclusive.

* * * * *